US011869866B2

(12) United States Patent
Suzuki et al.

(10) Patent No.: US 11,869,866 B2
(45) Date of Patent: Jan. 9, 2024

(54) WIRING FORMATION METHOD, METHOD FOR MANUFACTURING SEMICONDUCTOR DEVICE, AND SEMICONDUCTOR DEVICE

(71) Applicant: KIOXIA CORPORATION, Tokyo (JP)

(72) Inventors: Ryoichi Suzuki, Yokohama Kanagawa (JP); Hirokazu Kato, Tokyo (JP)

(73) Assignee: Kioxia Corporation, Tokyo (JP)

( * ) Notice: Subject to any disclaimer, the term of this patent is extended or adjusted under 35 U.S.C. 154(b) by 265 days.

(21) Appl. No.: 17/009,693

(22) Filed: Sep. 1, 2020

(65) Prior Publication Data

US 2021/0288017 A1    Sep. 16, 2021

(30) Foreign Application Priority Data

Mar. 12, 2020   (JP) ................ 2020-043282

(51) Int. Cl.
*H01L 23/00*     (2006.01)
*H01L 23/498*    (2006.01)
*H01L 21/768*    (2006.01)
*H01L 23/522*    (2006.01)
(Continued)

(52) U.S. Cl.
CPC ........ *H01L 24/43* (2013.01); *H01L 21/32139* (2013.01); *H01L 21/76885* (2013.01); *H01L 23/49827* (2013.01); *H01L 23/49894* (2013.01); *H01L 23/5226* (2013.01); *H01L 23/5283* (2013.01); *H01L 24/49* (2013.01); *H01L 2221/1068* (2013.01)

(58) Field of Classification Search
CPC ......... H01L 21/32139; H01L 21/76885; H01L 23/5226; H01L 23/5283; H01L 2221/1068
See application file for complete search history.

(56) References Cited

U.S. PATENT DOCUMENTS

| 7,396,475 | B2  |         | 7/2008 | Sreenivasan |            |
|-----------|-----|---------|--------|-------------|------------|
| 7,696,100 | B2  | *       | 4/2010 | Maekawa ... | B82Y 10/00 |
|           |     |         |        |             | 438/689    |
| 8,466,068 | B2  |         | 6/2013 | Scheuerlein |            |

(Continued)

FOREIGN PATENT DOCUMENTS

| CN | 1722366 A | 1/2006 |
|----|-----------|--------|
| CN | 1819176 A | 8/2006 |

(Continued)

OTHER PUBLICATIONS

Japanese Office Action dated Sep. 5, 2023, mailed in counterpart Japanese Application No. 2020-043282, 8 pages (with translation).

*Primary Examiner* — Marcos D. Pizarro
(74) *Attorney, Agent, or Firm* — Kim & Stewart LLP

(57) ABSTRACT

According to one embodiment, a wiring fabrication method includes pressing a first template including a first recessed portion and a second recessed portion provided at a bottom of the first recessed portion against a first film to form a first pattern including a first raised portion, corresponding to the first recessed portion, and a second raised portion, corresponding to the second recessed portion. The second raised portion protrudes from the first raised portion once formed. After forming the first pattern, a first wiring, corresponding to the first raised portion, and a via, corresponding to the second raised portion, is formed using the first pattern.

7 Claims, 19 Drawing Sheets

(51) Int. Cl.
*H01L 23/528* (2006.01)
*H01L 21/3213* (2006.01)

(56) References Cited

U.S. PATENT DOCUMENTS

| | | |
|---|---|---|
| 10,388,608 B2 | 8/2019 | Mitsukura et al. |
| 2003/0176014 A1 | 9/2003 | Hofmann |
| 2004/0211754 A1 | 10/2004 | Sreenivasan |
| 2004/0224261 A1 | 11/2004 | Resnick et al. |
| 2005/0266693 A1 | 12/2005 | Maekawa |
| 2006/0192287 A1 | 8/2006 | Ogawa et al. |
| 2007/0152372 A1 | 7/2007 | Chae et al. |
| 2007/0254455 A1 | 11/2007 | Yamaguchi |
| 2009/0057156 A1 | 3/2009 | Haba et al. |
| 2010/0210104 A1 | 8/2010 | Park |
| 2012/0125431 A1 | 5/2012 | Oizumi |
| 2013/0032945 A1 | 2/2013 | Lin |
| 2013/0069238 A1 | 3/2013 | Usami |
| 2014/0070324 A1 | 3/2014 | Hong |
| 2015/0085456 A1 | 3/2015 | Cok |
| 2017/0352550 A1 | 12/2017 | Tois |
| 2018/0310413 A1 | 10/2018 | Kasai et al. |
| 2019/0267229 A1* | 8/2019 | Isogai ............... H01L 21/32139 |
| 2020/0098685 A1* | 3/2020 | Lee .................. H01L 21/76892 |

FOREIGN PATENT DOCUMENTS

| | | |
|---|---|---|
| CN | 1991589 A | 7/2007 |
| CN | 102169850 A | 8/2011 |
| CN | 102804440 A | 11/2012 |
| CN | 103681604 A | 3/2014 |
| JP | H08306787 A | 11/1996 |
| JP | H09283619 A | 10/1997 |
| JP | 2001093978 A | 4/2001 |
| JP | 2006019707 A | 1/2006 |
| JP | 2006319255 A | 11/2006 |
| JP | 2006524919 A | 11/2006 |
| JP | 2007521645 A | 8/2007 |
| JP | 2010045231 A | 2/2010 |
| JP | 2011508459 A | 3/2011 |
| JP | 2013062464 A | 4/2013 |
| JP | 2017069461 A | 4/2017 |
| TW | 200917921 A | 4/2009 |
| TW | 201526723 A | 7/2015 |
| TW | 201720262 A | 6/2017 |
| TW | 201724449 A | 7/2017 |

* cited by examiner

WIRING FORMATION METHOD, METHOD FOR MANUFACTURING SEMICONDUCTOR DEVICE, AND SEMICONDUCTOR DEVICE

CROSS-REFERENCE TO RELATED APPLICATION (S)

This application is based upon and claims the benefit of priority from Japanese Patent Application No. 2020-043282, filed Mar. 12, 2020, the entire contents of which are incorporated herein by reference.

FIELD

Embodiments described herein relate generally to a wiring fabrication method, a method for manufacturing a semiconductor device, and a semiconductor device.

BACKGROUND

Most semiconductor devices include a plurality of wiring layers. With regard to wiring layers arranged adjacently to each other, one above the other, the wiring located in the lower layer (also referred to as a "lower-layer wiring") and the wiring located in the wiring the upper layer (also referred to as an "upper-layer wiring") are electrically interconnected to each other by a via.

DETAILED DESCRIPTION

Figure 1:
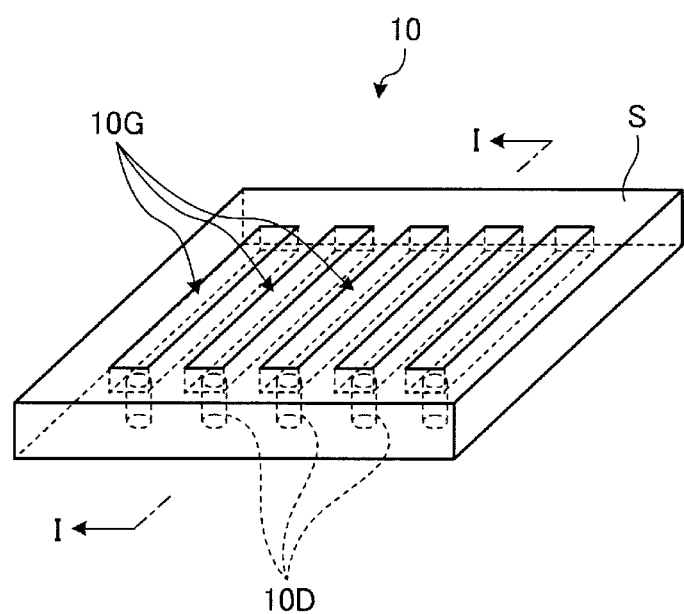
FIG. 1 is a perspective view schematically illustrating an example of a template which is usable for a wiring fabrication method according to a first embodiment.

Certain example embodiments provide a wiring fabrication method capable of forming wirings and vias in fewer processing steps, a method for manufacturing a semiconductor device, and a semiconductor device manufactured using a wiring fabrication method.

In general, according to one embodiment, a wiring fabrication method includes pressing a first template having a first recessed portion and a second recessed portion provided at a bottom of the first recessed portion against a first film to form a first pattern. The first pattern thus formed includes a first raised portion (corresponding to the first recessed portion) and a second raised portion (corresponding to the second recessed portion). The second raised portion protrudes upward from the first raised portion. After forming the first pattern, a first wiring (corresponding to the first raised portion) and a via (corresponding to the second raised portion) is formed using the first pattern in various techniques. The via protrudes from the first wiring.

Hereinafter, non-limiting example embodiments will be described with reference to the accompanying drawings. In the accompanying drawings, the same or corresponding members or components are assigned the respective same or associated reference characters, and any duplicated descriptions thereof may be omitted. Moreover, the drawings are schematic and not intended to represent relative dimensional ratios between members or components or between thicknesses of various layers, and, accordingly, specific thicknesses and dimensions in actual devices may be set by a person skilled in the art in view of the following examples.

First Embodiment

FIG. 1 is a perspective view schematically illustrating an example of a template (also referred to as an "original plate" or a "mold") which is usable for a wiring fabrication or formation method according to a first embodiment. The template 10 is formed from a material which transmits ultraviolet light, such as quartz glass. The template 10 includes a plurality of groove portions 10G and a plurality of recessed portions 10D provided in association with the plurality of groove portions 10G, as illustrated in FIG. 1. Each of the groove portions 10G has the shape of a hollow elongate rectangular parallelepiped cut into the template 10 from an upper surface S of the template 10, and extends lengthwise along one direction. The groove portion 10G corresponds to a wiring which is formed according to the present embodiment. The recessed portion 10D has the shape of a cylinder extending from the bottom surface of the groove portion 10G into the template 10. The width of the recessed portion 10D may be shorter than the length of the groove portion 10G as viewed along the above-mentioned one direction, and may be the same as the width of the groove portion 10G as viewed along a direction perpendicular to the above-mentioned one direction. The recessed portion 10D corresponds to a via which is formed by the method according to the present disclosure.

In the following description about the wiring formation and fabrication methods according to the present disclosure, the template 10 illustrated in FIG. 1 is assumed to be used as an example.

FIGS. 2A, 2B, 2C, 2D, 2E, 2F, 2G, 2H, 2I, 2J, 2K, 2L, 2M, 2N, 2O, 2P, and 2Q are each diagrams schematically illustrating cross sections obtained by processes by which a wiring pattern is formed in the wiring fabrication method according to the first embodiment, and these diagrams each correspond to a cross section of the device being manufactured taken along line I-I illustrated in FIG. 1.

Figure 2A:
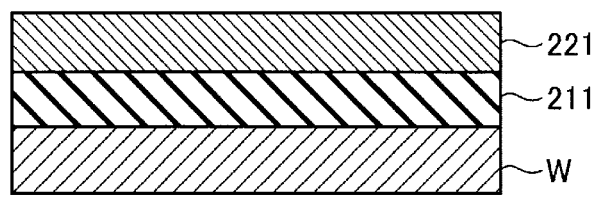
FIGS. 2A, 2B, 2C, 2D, 2E, 2F, 2G, 2H, 2I, 2J, 2K, 2L, 2M, 2N, 2O, 2P, and 2Q are diagrams schematically depicting wiring pattern cross sections obtained during processes of a wiring fabrication method according to a first embodiment.

Referring to FIG. 2A, an insulating film 211 is formed on a wafer W, and a conductive material film 221 is formed on the insulating film 211. The wafer W is a semiconductor substrate such as a silicon wafer, and an element such a metal-oxide semiconductor (MOS) transistor or a wiring may have been previously formed in the silicon wafer.

The insulating film 211 may be, for example, a silicon oxide (SiOx) film, and may be formed by, for example, the chemical vapor deposition (CVD) method. However, the insulating film 211 is not limited to a film formed from SiOx, but may be formed from silicon oxide nitride (SiON) or carbon-doped silicon oxide (SiCOH). Additionally, the insulating film 211 may be a spin-on glass (SOG) film. A via which interconnects an element or wiring on the wafer W with another wiring may be already formed in the insulating film 211.

The conductive material film 221 is typical formed from a metal or alloy, and examples of the metal include copper (Cu) and tungsten (W). In the case of forming the conductive material film 221 from Cu, a plating method can be used, and, in the case of forming the conductive material film 221 from W, a CVD method can be used. Additionally, the conductive material film 221 may be formed from, for example, aluminum (Al) or silicon-copper-aluminum (Si—Cu—Al). In these cases, the conductive material film 221 may be formed by, for example, a sputtering method.

Figure 2B:
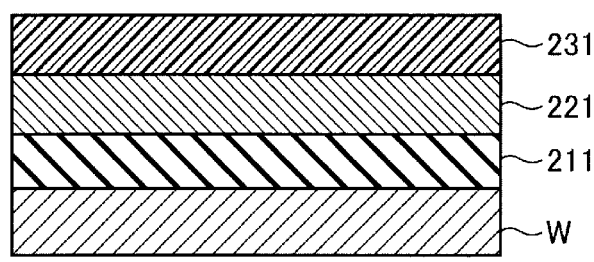

Next, as illustrated in FIG. 2B, a resist layer 231 is formed on the conductive material film 221. The resist layer 231 may initially be formed on the wafer W by a spin coat method. In some examples, the resist layer 231 may be formed by dispensing a resist material from a nozzle on the wafer W or may be formed by ejecting a resist material from an inkjet nozzle or the like as droplets. Furthermore, while, in subsequent processes, several resist layers are used, these resist layers may likewise be formed in a similar way to those described with regard to resist layer 231.

Figure 2C:
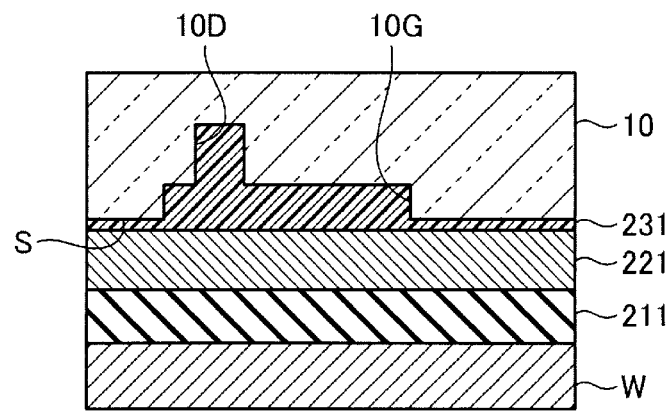
Figure 2D:
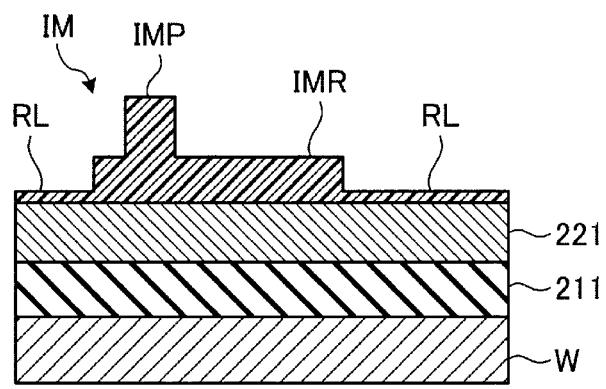

Next, as illustrated in FIG. 2C, the template 10 (illustrated in FIG. 1) is pressed against the resist layer 231. With this pressing, the resist layer 231 is deformed, so that the groove portion 10G and the recessed portion 10D of the template 10 are filled with a resist. When, with the template 10 kept pressed against the resist layer 231, the resist is irradiated with ultraviolet light via the template 10, the resist becomes hardened (cured). Upon detaching of the template 10, as illustrated in FIG. 2D, an imprint resist mask IM with the shapes of the groove portion 10G and the recessed portion 10D of the template 10 reflected therein (hereinafter referred to simply as a "resist mask IM") is obtained. Thus, the resist mask IM includes a protruding portion IMR corresponding to the groove portion 10G and a projection portion IMP corresponding to the recessed portion 10D.

Figure 2E:
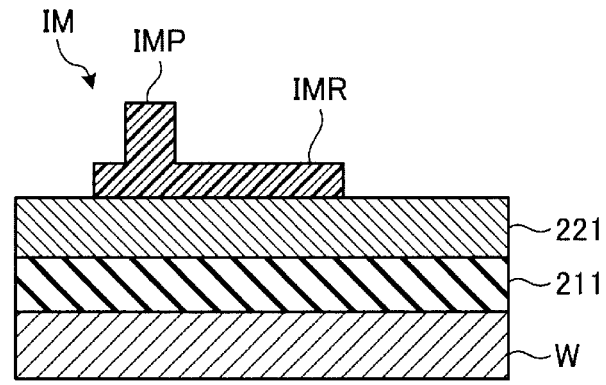

Subsequently, a residual resist film RL is removed by, for example, etching. The residual resist film RL is composed of a resist remaining between the upper surface S (illustrated in FIG. 2C) of the template 10 and the conductive material film 221 when the template 10 is pressed against the resist layer 231. With the residual resist film RL removed, the resist mask IM is left on the conductive material film 221, and, in a region other than the resist mask IM, the upper surface of the conductive material film 221 becomes exposed as illustrated in FIG. 2E.

Figure 2F:
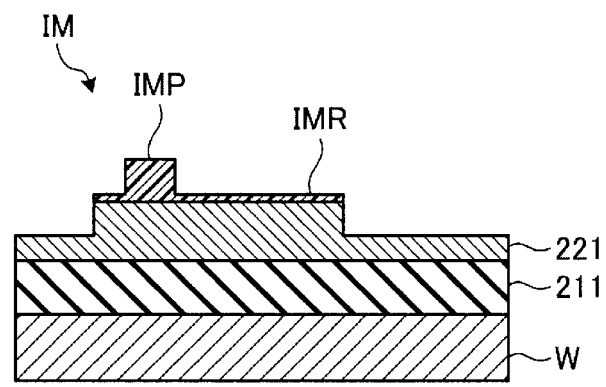

Next, etching is performed on the conductive material film 221 with the resist mask IM used as a mask therefor. This etching to be used may include, for example, a plasma etching method such as the reactive ion etching (RIE) method. When etching has started, as illustrated in FIG. 2F, the conductive material film 221 is progressively etched starting with the exposed upper surface thereof. In association with this etching, the resist mask IM is also progressively etched in such a way as to become thinner.

Figure 2G:
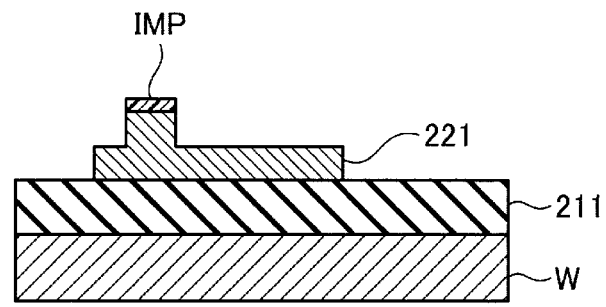

As the protruding portion IMR ultimately disappears and only the projection portion IMP is left, the conductive material film 221 is further etched with only the projection portion IMP serving as a mask. With this further etching, as illustrated in FIG. 2G, a remaining portion of the conductive material film 221 previously left by with the resist mask IM is further removed along with some portion of the conductive material film 221 that was previously covered by the protruding portion IMR.

Figure 2H:
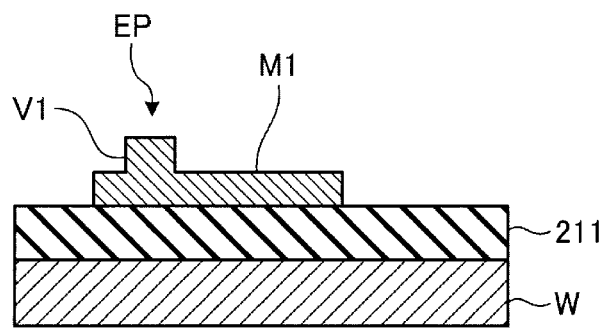

When, after the elapse of a predetermined time, etching is stopped and the remaining projection portion IMP is removed, as illustrated in FIG. 2H, a conductive portion EP is obtained.

The conductive portion EP includes as portions a wiring M1 and a via V1. The wiring M1 and the via V1 are formed as a single, integrated body by an etching process. The wiring M1 has a shape corresponding to that of the groove portion 10G of the template and the via V1 has a shape corresponding to that of the recessed portion 10D of the template 10. Thus, the wiring M1 extends lengthwise along one direction, and the via V1 protrudes beyond the upper surface of the wiring M1 in a columnar shape. The width of the via V1 may be shorter than the length of the wiring M1 as viewed along the above-mentioned one direction, or may be the same as the width of the wiring M1 as viewed along a direction perpendicular to the above-mentioned one direction.

Furthermore, in the resist mask IM, the height from the upper surface of the protruding portion IMR to the upper surface of the projection portion IMP, i.e., the depth of the recessed portion from the bottom portion of the groove portion 10G illustrated in FIG. 1, is set in such a manner that the projection portion IMP remains as much as a desired height on the conductive portion EP at the time of stoppage of etching. This enables the via V1 to be formed in such a way as to extend from the upper surface of the wiring M1.

Figure 2I:
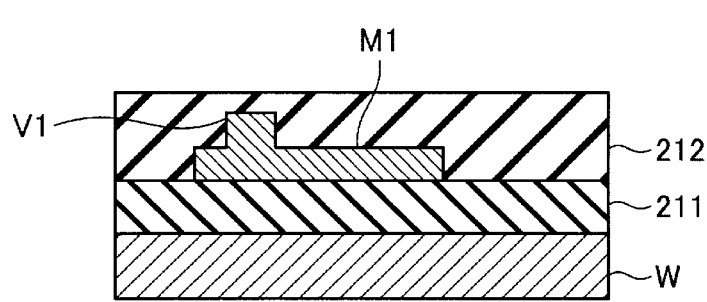
Figure 2J:
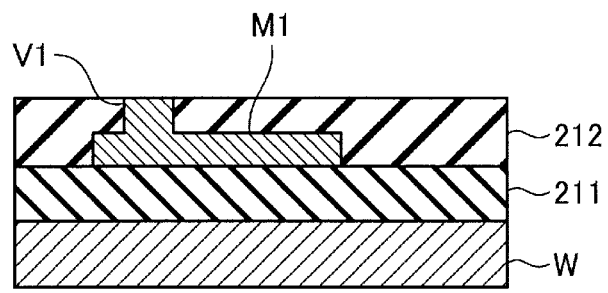

Subsequently, an insulating film 212 is formed on the conductive portion EP and the insulating film 211 in such a way as to cover the conductive portion EP, as illustrated in FIG. 2I. The insulating film 212 can be formed from the same material as the material of the insulating film 211. After that, the insulating film 212 is polished by a chemical mechanical polishing (CMP) method, so that the upper surface of the insulating film 212 becomes flush with the upper surface of the via V1 of the conductive portion EP as illustrated in FIG. 2J.

Figure 2K:
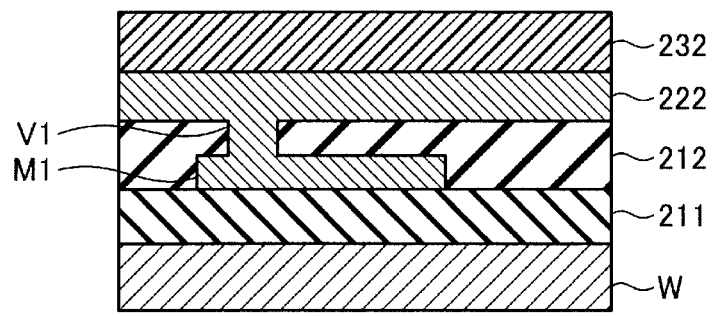

After that, as illustrated in FIG. 2K, a conductive material film 222 is formed on the upper surface of the insulating film 212 and the upper surface of the via V1 of the conductive portion EP, and a resist layer 232 is then formed on the conductive material film 222. In the present embodiment, the conductive material film 222 is formed from the same material as that of the conductive material film 221 and by the same method as that employed therefor. Here, since the upper surface of the via V1 is exposed on the upper surface of the insulating film 212, the conductive material film 222 is electrically connected to the via V1. The resist layer 232 may be formed in a similar way to that in the above-mentioned resist layer 231. In some examples, the conductive material film 222 may be formed from a conductive material different from that of the conductive material film 221.

Next, a template 11 is pressed against the resist layer 232. Unlike the template 10, the template 11 has a groove portion 11G, but does not have a portion corresponding to the recessed portion 10D. The groove portion 11G corresponds to a wiring in a wiring layer located above the wiring M1.

Figure 2L:
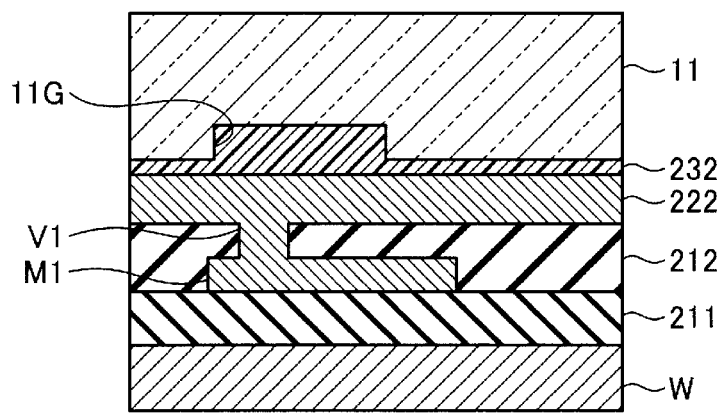
Figure 2M:
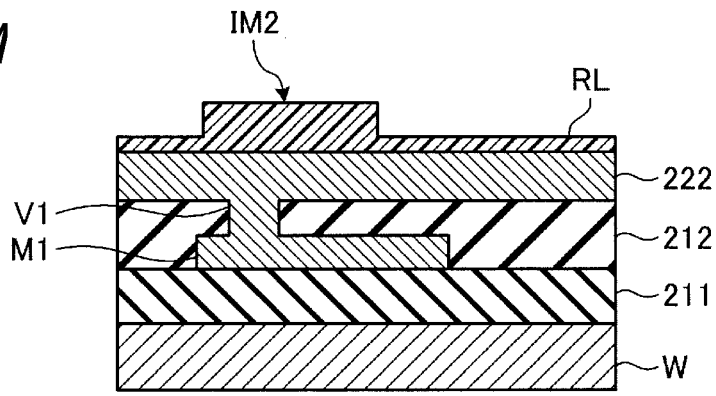
Figure 2N:
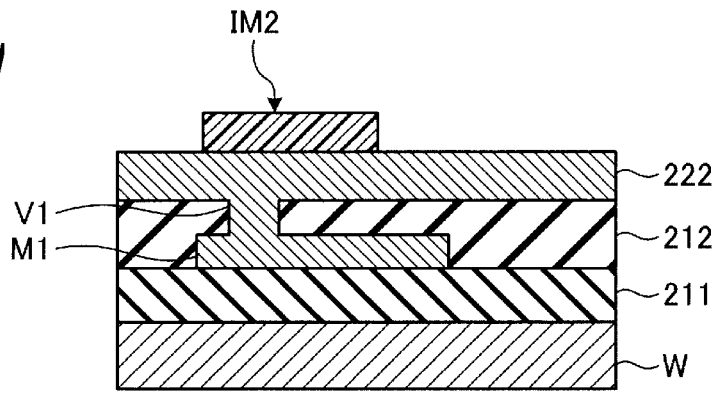

With the template 11 pressed against the resist layer 232, as illustrated in FIG. 2L, the groove portion 11G is filled with a resist. When, with the template 11 kept pressed against the resist layer 232, the resist is irradiated with ultraviolet light via the template 11, the resist becomes hardened. Upon detaching of the template 11, as illustrated in FIG. 2M, a resist mask IM2 is obtained. Subsequently, upon removal of a residual resist film RL by, for example, etching, as illustrated in FIG. 2N, just the resist mask IM2 is left on the conductive material film 222, and the upper surface of the conductive material film 222 becomes exposed in a portion thereof other than a portion covered by the resist mask IM2.

Figure 2O:
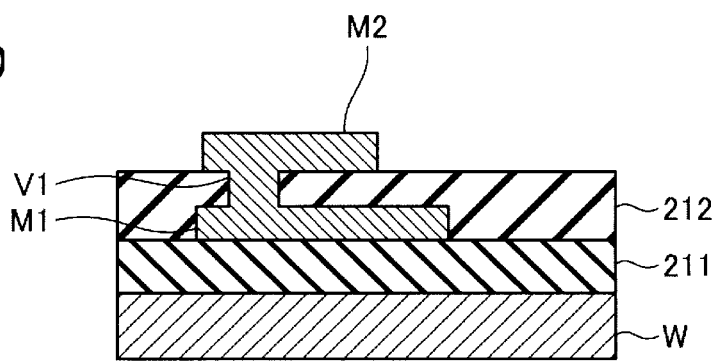
Figure 2P:
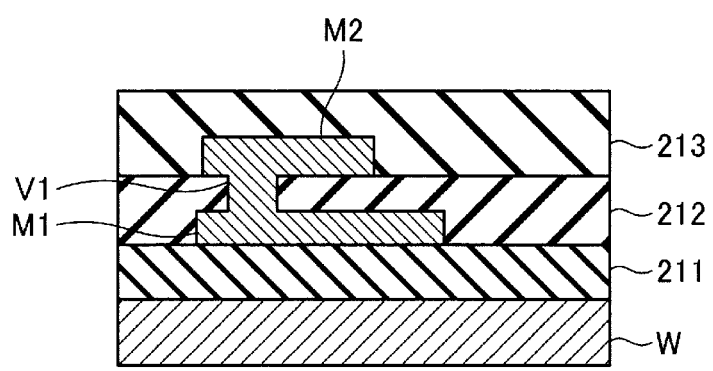

Next, etching is performed on the conductive material film 222 with the resist mask IM2 used as a mask therefor. This etching may be performed in a similar way to that for the above-mentioned conductive material film 221. With this etching performed, a wiring M2 is formed as illustrated in FIG. 2O. The wiring M2 is electrically connected to the wiring M1 via the via V1. After that, as illustrated in FIG. 2P, an insulating film 213 is formed on the wiring M2 and the insulating film 212 in such a way as to cover the wiring M2.

Figure 2Q:
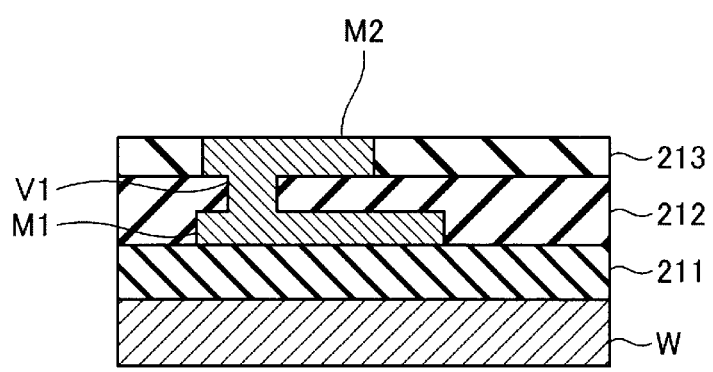

In the first embodiment, the insulating film 213 is formed from the same material as that of the insulating film 211 or 212 and by the same method as that employed therefor. After that, the insulating film 213 is polished by the CMP method, so that the upper surface of the wiring M2 becomes flush with the upper surface of the insulating film 213, as illustrated in FIG. 2Q. With the above-described processes performed, the wiring M1 and the wiring M2, which are electrically connected to each other via the via V1, are formed.

The insulating film 213 may be formed from an insulating material different from that of the insulating film 211 or 212. The wiring M2 may extend lengthwise along the same direction as which the wiring M1 extends lengthwise or may extend lengthwise along a direction different from the direction along which the wiring M1 extends lengthwise. Additionally, the extension length of the wiring M2 may be greater than the width of the via V1.

As described above, according to the wiring fabrication method described in the first embodiment, the resist mask IM is formed by pressing the template 10 against the resist layer 231 formed on the conductive material film 221. Since the template has the groove portion 10G and the recessed portion 10D, the resist mask IM is formed in such a way as to have the projection portion IMP, which corresponds to the recessed portion 10D, and the protruding portion IMR, which corresponds to the groove portion Since the resist mask IM formed in this way is used as a mask to perform etching on the conductive material film 221, the wiring M1 and the via V1 are formed as a single body.

Comparative Example

A configuration in which a lower-layer wiring (similar to wiring M1) and an upper-layer wiring (similar to wiring M2) are electrically interconnected by a via (similar to via V1) may be formed by, for example, a dual-Damascene method. In the following description, processes for forming a lower-layer wiring, an upper-layer wiring, and a via located between the lower-layer wiring and the upper-layer wiring by the dual-Damascene method without using a template are described as a comparative example with reference to FIGS. 3A, 3B, 3C, 3D, 3E, and 3F.

Figure 3A:
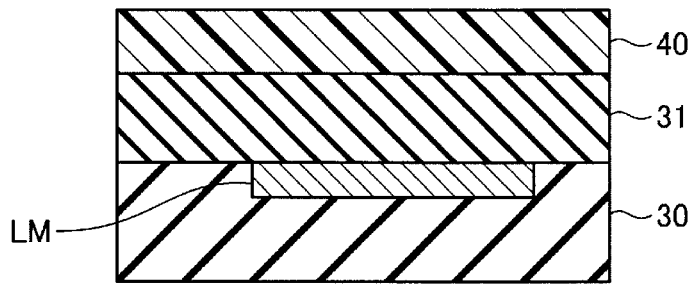
FIGS. 3A, 3B, 3C, 3D, 3E, and 3F are diagrams schematically depicting wiring pattern cross sections obtained during processes of a wiring fabrication method according to a comparative example.

As illustrated in FIG. 3A, an insulating film 31 is formed on an insulating film 30, and a photoresist layer 40 is formed on the insulating film 31. The insulating film 30 or 31 may be formed from, for example, SiOx. A lower-layer wiring LM is embedded in the insulating film 30. The lower-layer wiring LM embedded in the insulating film 30 may be formed by, for example, a Damascene method. Furthermore, note that in FIGS. 3A to 3F, a wafer substrate located below the insulating film 30 has been omitted from illustration.

Figure 3B:
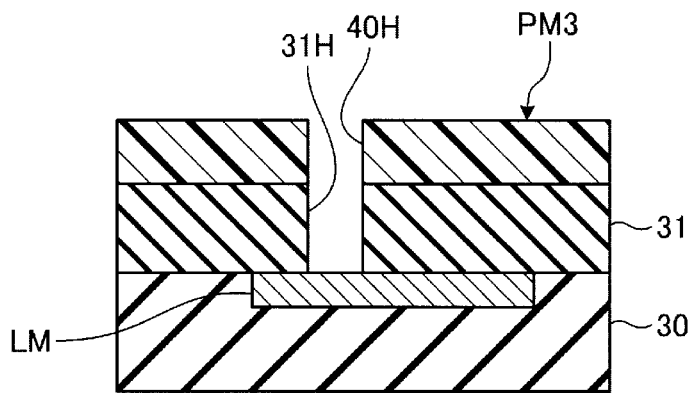

Next, an opening 40H is formed at a predetermined position in the photoresist layer 40 by a technique for lithography, so that a photoresist mask PM3 is formed, and etching is then performed on the insulating film 31 with the photoresist mask PM3 used as a mask therefor. This etching terminates when the upper surface of the lower-layer wiring LM becomes exposed. This etching forms a hole 31H in the insulating film 31 as illustrated in FIG. 3B.

Figure 3C:
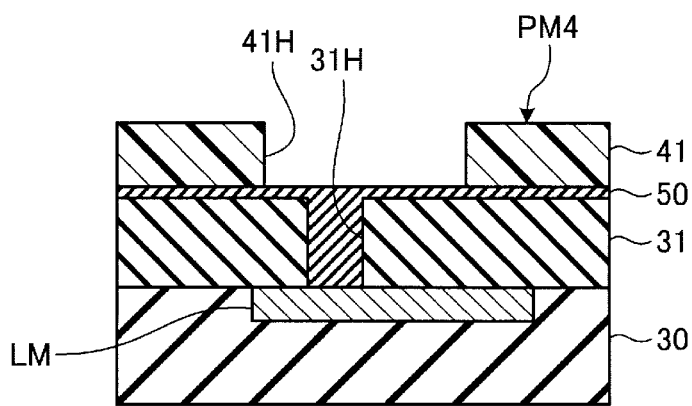

Next, the photoresist layer 40 is removed, and, for example, a spin-on material layer 50 is formed on the insulating film 31. At this time, the hole 31H formed in the insulating film 31 is filled with the spin-on material, and the upper surface of the spin-on material layer 50 is substantially flat. Next, a photoresist layer 41 is formed on the spin-on material layer 50, and an opening 41H is then formed in the photoresist layer 41. With this formation performed, a photoresist mask PM4 is formed as illustrated in FIG. 3C.

Figure 3D:
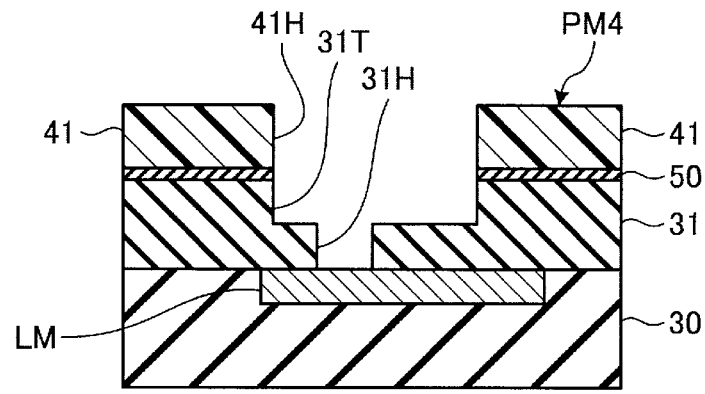

Subsequently, the insulating film 31 is etched with the photoresist mask PM4 used as a mask therefor. More specifically, first, the spin-on material layer 50 exposed at the opening 41H is etched, and, next, the insulating film 31 is progressively etched away. When, after the elapse of a predetermined time or otherwise, etching is stopped, a trench 31T corresponding to the opening 41H of the photoresist layer 41 is formed in the insulating film 31 as illustrated in FIG. 3D. Thus, the trench 31T and the hole 31H, which is continuous to the trench 31T, are formed in the insulating film 31.

Figure 3E:
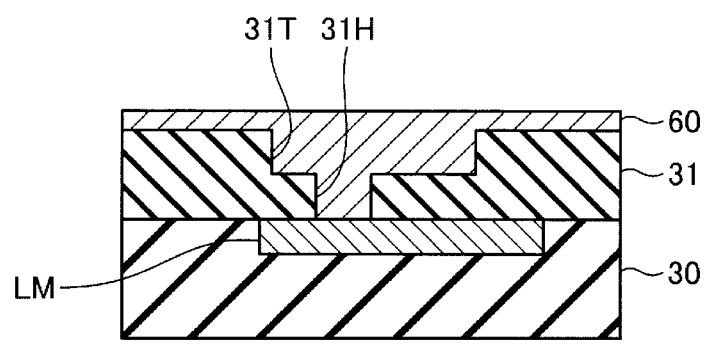

Next, the spin-on material layer 50 and the photoresist mask PM4 left on the insulating film 31 are removed, and, as illustrated in FIG. 3E, a metallic layer 60 is formed on the insulating film 31. The metallic layer 60 may be formed from copper by, for example, a plating method. The trench 31T and the hole 31H are also filled with copper in this process. In the case of forming the metallic layer 60 from copper by the plating method, a barrier layer and a seed layer are generally required, but these thin layers are not separately illustrated.

Upon removal of a portion of the metallic layer 60 located on a level above the upper surface of the insulating film 31 by a CMP method, the upper surface of the metallic layer 60 and the upper surface of the insulating film 31 become flush with each other.

Figure 3F:
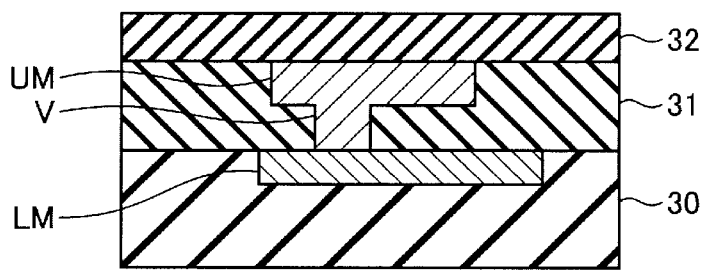

An insulating film 32 is formed on these surfaces, as illustrated in FIG. 3F, and thus a wiring structure in which the lower-layer wiring LM and an upper-layer wiring UM are electrically interconnected by a via V is formed.

As described above, in the comparative example, to which the dual-Damascene method is applied, the hole 31H used for forming the via V is formed in the insulating film 31 with use of the photoresist mask PM3, as illustrated in FIG. 3B, and the trench 31T used for forming the upper-layer wiring UM is formed with use of the photoresist mask PM4, as illustrated in FIG. 3D. Thus, two different photoresist masks are required for making a via and an upper-layer wiring.

On the other hand, in the wiring fabrication method according to the first embodiment, the lower-layer wiring M1 and the via V1 are able to be collectively formed as a single body with use of a single imprint template to make the resist mask IM. Thus, according to the first embodiment, it is possible to form a via and a wiring with fewer patterning processes than the dual-Damascene method.

Moreover, according to the first embodiment, the via V1 is formed based on the recessed portion 10D of the template 10. Since any large pressure is unlikely to be applied to the recessed portion 10D, the recessed portion 10D is unlikely to be deformed, and, accordingly, the template 10 is enabled to be used over a long period.

Furthermore, in the comparative example, after the lower-layer wiring LM is formed, the via V and the upper-layer wiring UM, which are electrically connected to the lower-layer wiring LM, are formed. In other words, the via V and the upper-layer wiring UM are integrally formed independently of the lower-layer wiring LM. In this case, since the lower end surface of the via V is joined with the upper surface of the lower-layer wiring LM, a joint interface exists between the upper surface of the lower-layer wiring LM and the lower end surface of the via V. For example, the joint interface is defined by, for example, a natural oxide film formed on the upper surface of the lower-layer wiring LM or an inconsistency between the grain boundary of metal in the lower-layer wiring LM and the grain boundary of metal in the via V, and is able to be observed with, for example, a scanning electron microscope (SEM) or a transmission electron microscope (TEM).

On the other hand, according to the first embodiment, after the lower-layer wiring M1 and the via V1 are collectively formed as a single body, the upper-layer wiring M2 is formed. Accordingly, the joint interface is formed between only the via V1 and the wiring M2. Thus, if a joint interface is observed only between the via V1 and the upper-layer wiring M2, the implementation of the wiring formation method described in the first embodiment can be assumed.

Second Embodiment

Next, a wiring fabrication method according to a second embodiment is described with reference to FIGS. 4A, 4B, 4C, 4D, 4E, 4F, 4G, 4H, 4I, 4J, 4K, 4L, 4M, 4N, and 4O with a focus being made on differences from the wiring fabrication method described in the first embodiment.

Figure 4A:
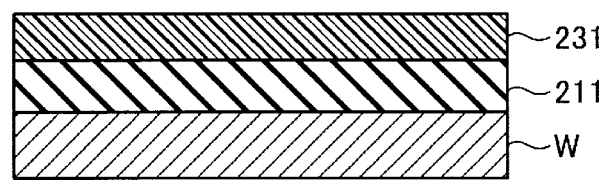
FIGS. 4A, 4B, 4C, 4D, 4E, 4F, 4G, 4H, 4I, 4J, 4K, 4L, 4M, 4N, and 4O are diagrams schematically depicting wiring pattern cross sections obtained during processes of a wiring fabrication method according to a second embodiment.

Referring to FIG. 4A, an insulating film 211 is formed on a wafer W, and a resist layer 231 is formed on the insulating film 211. While, in the first embodiment, a conductive material film 221 was formed between the insulating film 211 and the resist layer 231 (as illustrated in FIG. 2B), in the second embodiment, there is no conductive material film 221.

Figure 4B:
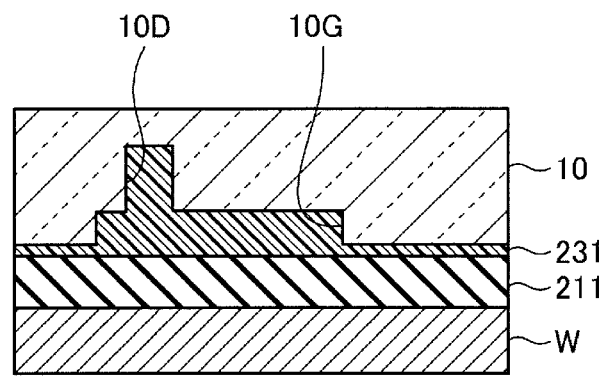

Next, as illustrated in FIG. 4B, a template 10, which is also used in the first embodiment, is pressed against the resist layer 231. With this pressing, a groove portion 10G and a recessed portion 10D of the template 10 are filled with a resist. Next, when, with the template 10 kept pressed against the resist layer 231, the resist is irradiated with ultraviolet light through the template 10, the resist becomes hardened.

Figure 4C:
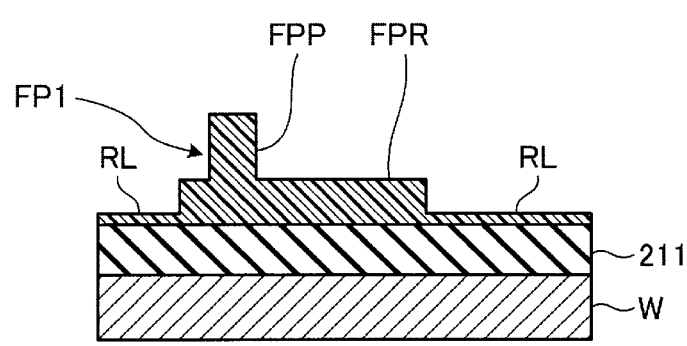
Figure 4D:
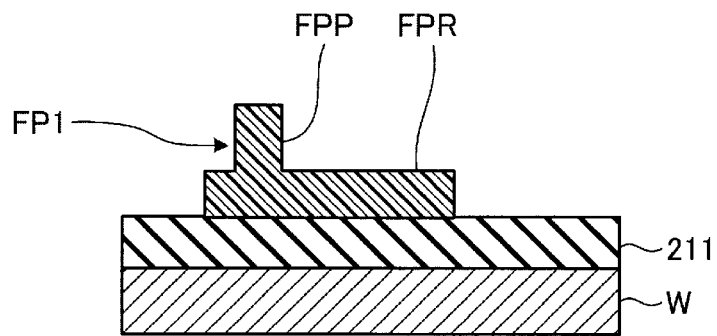

Upon detaching of the template 10, as illustrated in FIG. 4C, a resist pattern FP1 with the shapes of the groove portion 10G and the recessed portion 10D of the template 10 reflected therein is obtained. The resist pattern FP1 includes a projection portion FPP corresponding to the recessed portion 10D and a protruding portion FPR corresponding to the groove portion 10G. Subsequently, once a residual resist film RL is removed by, for example, etching, as illustrated in FIG. 4D, just the resist pattern FP1 is left on the insulating film 211.

Figure 4E:
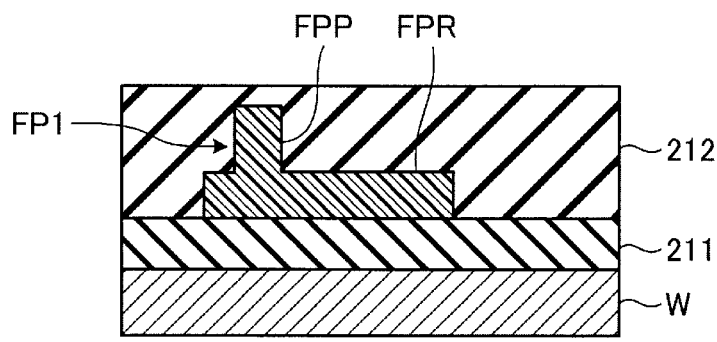
Figure 4F:
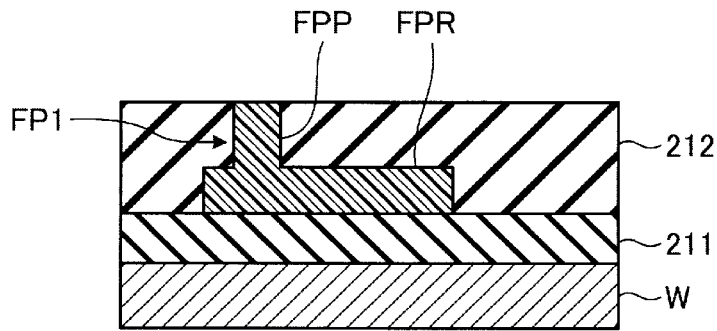

Next, as illustrated in FIG. 4E, an insulating film 212 is formed on the resist pattern FP1 and the insulating film 211. After that, as illustrated in FIG. 4F, the insulating film 212 is polished by the CMP method, so that the upper surface of the projection portion FPP of the resist pattern FP1 becomes flush with the upper surface of the insulating film 212.

Figure 4G:
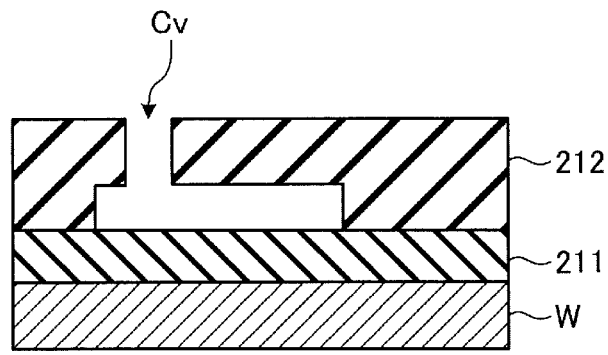

Subsequently, the resist pattern FP1 is removed by isotopic etching processes. More specifically, the resist pattern FP1 starting with the exposed upper surface thereof is removed by isotropic etching, so that a cavity Cv, which has a shape corresponding to the shape of the resist pattern FP1, is formed in the insulating film 212, as illustrated in FIG. 4G.

Figure 4H:
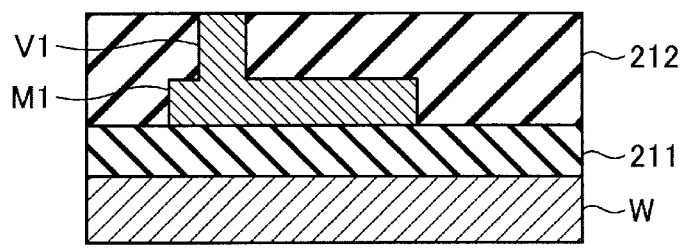

After that, the cavity Cv is filled with, for example, a metal (e.g., W, Al, or Si—Cu—Al) such as Cu by a plating or CVD method. In other words, the resist pattern FP1 in the insulating film 212 is substituted by a metal. As a result, as illustrated in FIG. 4H, the wiring M1 and the via V1 are collectively formed as a single body. The wiring M1 has a shape corresponding to that of the groove portion 10G of the template 10, and the via V1 has a shape corresponding to that of the recessed portion 10D of the template 10. Thus, as with the first embodiment, the wiring M1 extends lengthwise along one direction, and the via V1 protrudes over the upper surface of the wiring M1 in a columnar shape. The width of the via V1 may be shorter than the length of the wiring M1 as viewed along the above-mentioned one direction, and may be the same as the width of the wiring M1 as viewed along a direction perpendicular to the above-mentioned one direction.

Figure 4I:
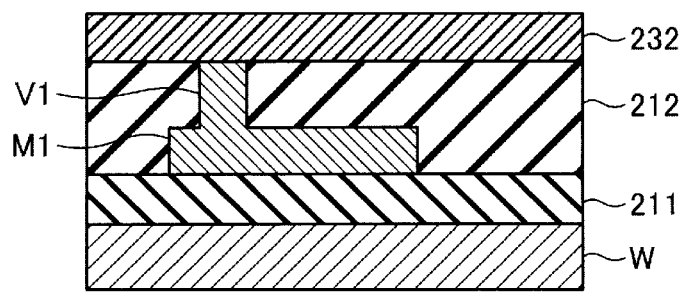
Figure 4J:
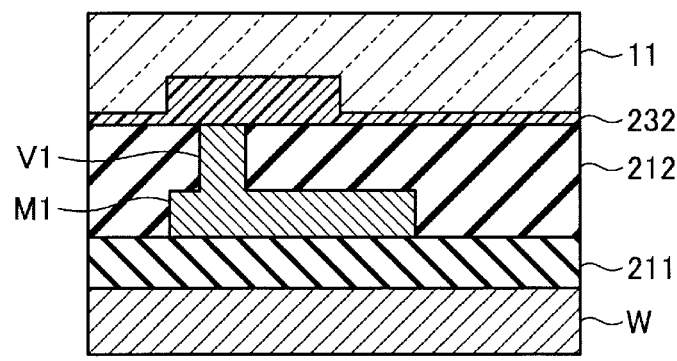
Figure 4K:
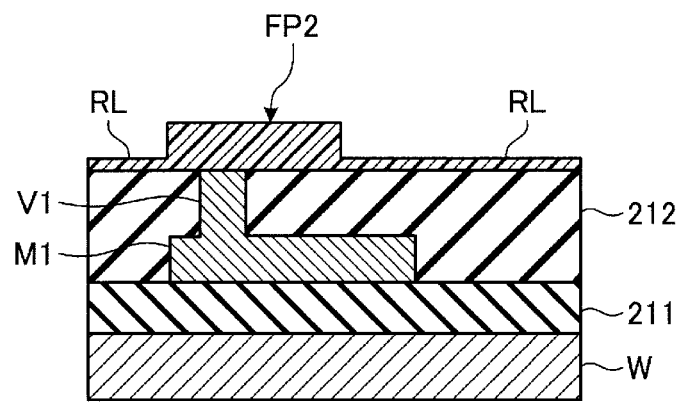
Figure 4L:
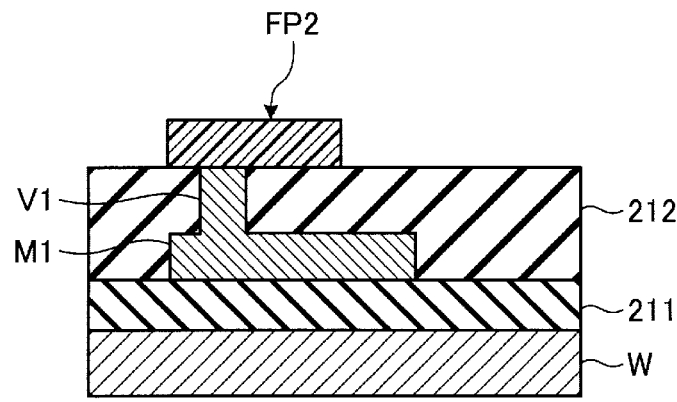
Figure 4M:
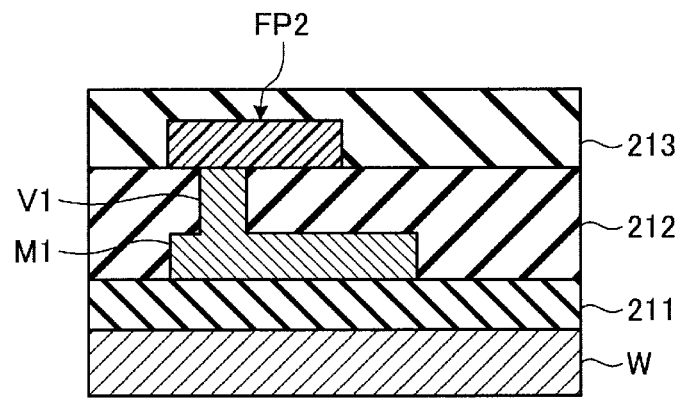
Figure 4N:
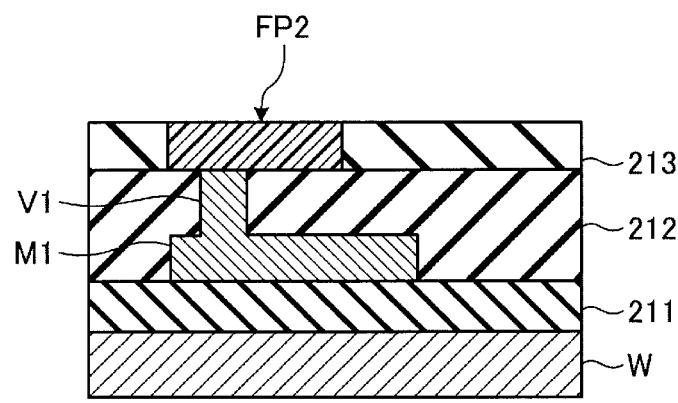
Figure 4O:
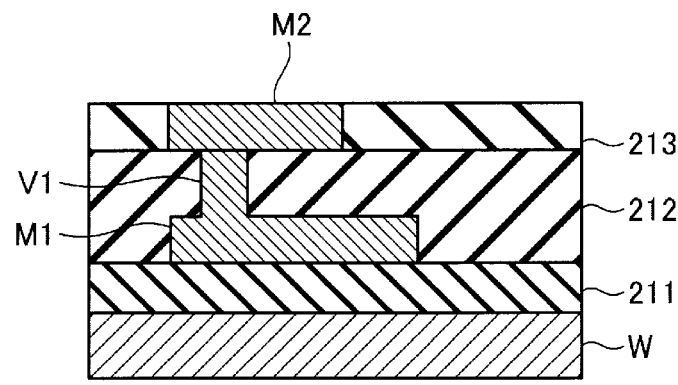

After that, a resist layer 232 is formed on the via V1 and the insulating film 212 as illustrated in FIG. 4I. Subsequently, a template 11 is pressed against the resist layer 232 as illustrated in FIG. 4J, so that a resist pattern FP2 is formed as illustrated in FIG. 4K. After a residual resist film RL is removed (as illustrated in FIG. 4L), an insulating film 213 is formed on the resist pattern FP2 and the insulating film 212 (as illustrated in FIG. 4M). Then, the insulating film 213 is polished by a CMP method, so that the upper surface of the resist pattern FP2 becomes flush with the upper surface of the insulating film 213, as illustrated in FIG. 4N. After that, the resist pattern FP2 is removed by etching, so that a space corresponding to the resist pattern FP2 is produced. After that, the space is filled with, for example, a metal such as Cu by plating or CVD. With this process, a wiring M2 is formed as illustrated in FIG. 4O. The wiring M2 may be formed from the same metal as that of the wiring M1 and the via V1, or may be formed from a different metal. The wiring M2 may extend lengthwise along the same direction as which the wiring M1 extends lengthwise or may extend lengthwise along a direction different from the direction along which the wiring M1 extends lengthwise. Additionally, the extension length of the wiring M2 may be greater than the width of the via V1.

As described above, according to the second embodiment, the resist pattern FP1 is formed by pressing the template 10 against the resist layer 231. The resist pattern FP1 has the protruding portion FPR and the projection portion FPP, which correspond to the groove portion 10G and the recessed portion 10D of the template respectively. Then, the resist pattern FP1 is substituted by a metal, so that the via V1, which corresponds to the projection portion FPP, and the wiring M1, which corresponds to the protruding portion FPR, are formed. Thus, the wiring M1 and the via V1 are collectively formed as a single body from a single resist pattern FP1. Accordingly, in the second embodiment, advantageous effects similar to those in the first embodiment are attained.

Furthermore, in the second embodiment, after the via V1 and the wiring M1 are formed as illustrated in FIG. 4H, for example, the same procedure as described with reference to FIG. 2K to FIG. 2Q in the first embodiment may be utilized.

Third Embodiment

Next, a wiring fabrication method according to a third embodiment is described with reference to FIGS. 5A, 5B, 5C, 5D, 5F, 5G, 5H, 5I, 5J, and 5K with a focus on differences from the wiring fabrication method described in the second embodiment.

Figure 5A:
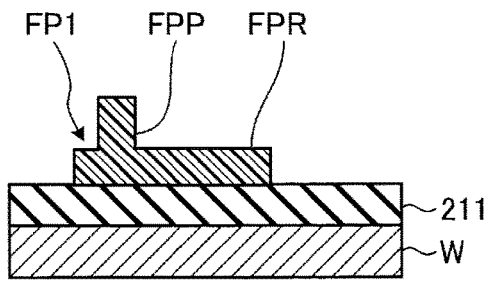
FIGS. 5A, 5B, 5C, 5D, 5E, 5F, 5G, 5H, 5I, 5J, and 5K are diagrams schematically depicting wiring pattern cross sections obtained during processes of a wiring fabrication method according to a third embodiment.

Referring to FIG. 5A, a resist pattern FP1 is formed on an insulating film 211 formed on a wafer W. The resist pattern FP1 has a protruding portion FPR, which corresponds to a groove portion of a template 10 (illustrated in FIG. 1), and a projection portion FPP, which corresponds to a recessed portion 10D of the template 10. Such a configuration can be formed by performing the same processes illustrated in FIG. 4A to FIG. 4D, for example.

Next, a metal infiltrating treatment (metallization process) of infiltrating the resist pattern FP1 with metallic elements is performed. Specifically, inside a vacuum chamber, the wafer W, the insulating film 211, and the resist pattern FP1 are kept at a temperature in the range of about 80° C. to about 300° C. (for example, 200° C.), and a trimethylaluminum (TMA) gas is introduced into the vacuum chamber. With this process, the resist pattern FP1 is exposed to the TMA gas, and the resist pattern FP1 is infiltrated with the TMA gas starting from the outer surface (i.e., the upper surface and side surfaces) of the resist pattern FP1. After the elapse of a predetermined time, the TMA gas is purged, and an oxidation gas such as water vapor ($H_2O$), ozone ($O_3$) gas, or oxygen ($O_2$) gas is introduced into the vacuum chamber. The TMA infiltrated into the resist pattern FP1 is oxidized by the oxidation gas, so that metallic aluminum is precipitated. Therefore, the resist pattern FP1 is made electrically conductive.

Figure 5D:
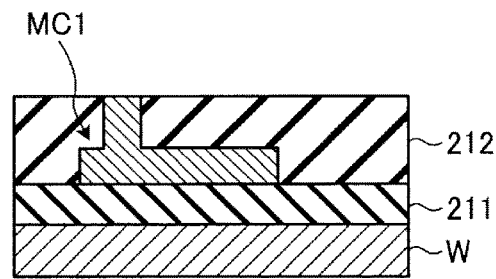
Figure 5B:
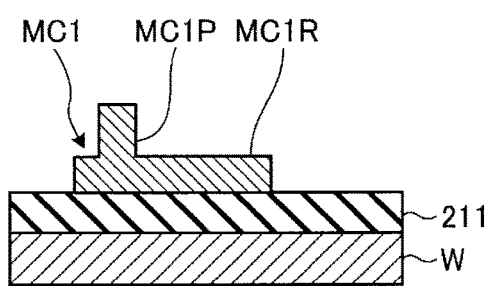

In the following description, as illustrated in FIG. 5B, a resist pattern FP1 having electrical conductivity is referred to as a "metal-containing portion MC1". The metal-containing portion MC1 has a projection portion MC1P and a protruding portion MC1R. The projection portion MC1P is formed from the projection portion FPP of the resist pattern FP1, and the protruding portion MC1R is formed from the protruding portion FPR of the resist pattern FP1. Since the protruding portion FPR has a shape corresponding to that of the groove portion 10G of the template 10 (illustrated in FIG. 1), the protruding portion MC1R also has a shape corresponding to that of the groove portion 10G. Moreover, since the projection portion FPP has a shape corresponding to that of the recessed portion 10D of the template 10, the projection portion MC1P also has a shape corresponding to that of the recessed portion 10D. Thus, the protruding portion MC1R extends lengthwise along one direction, and the projection portion MC1P projects over the upper surface of the protruding portion MC1R in a columnar shape. The width of the projection portion MC1P may be shorter than the length of the protruding portion MC1R as viewed along the above-mentioned one direction, and may be the same as the width of the protruding portion MC1R as viewed along a direction perpendicular to the above-mentioned one direction.

Furthermore, the cycle of the TMA gas and water vapor introduction into the vacuum chamber may be repeated a plurality of times. This enables an increase in the Al atom concentration inside the metal-containing portion MC1.

Figure 5E:
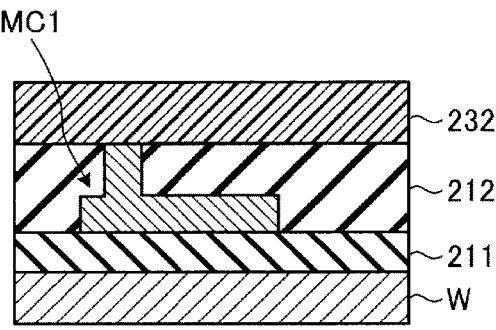
Figure 5C:
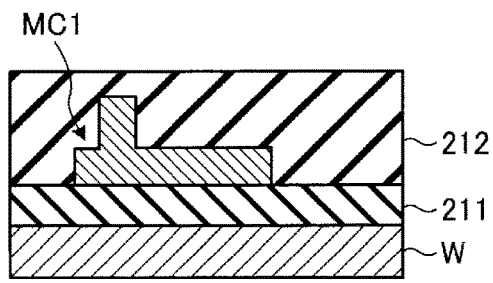
Figure 5F:
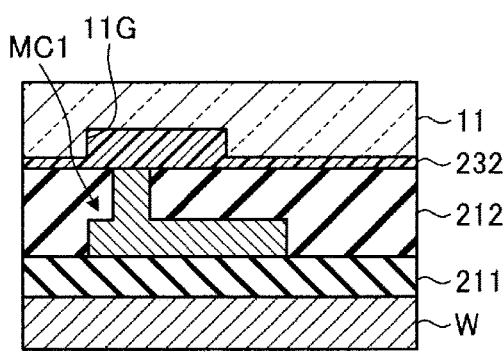
Figure 5G:
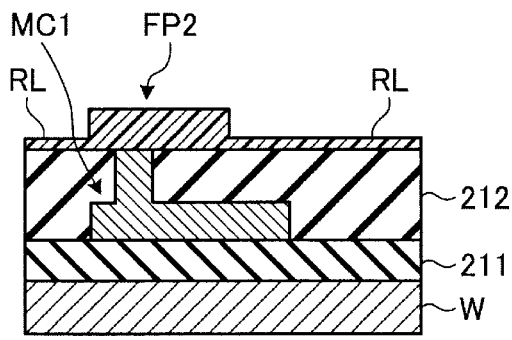

Subsequently, an insulating film 212 is formed on the metal-containing portion MC1 and the insulating film 211 as illustrated in FIG. 5C, and the insulating film 212 is then polished by a CMP method, so that the upper surface of the insulating film 212 becomes flush with the upper surface of the metal-containing portion MC1 as illustrated in FIG. 5D. After that, a resist layer 232 is provided on the metal-containing portion MC1 and the insulating film 212 as illustrated in FIG. 5E, and a template 11 is then pressed against the resist layer 232 as illustrated in FIG. 5F. When, with the template 11 kept pressed against the resist layer 232, the resist layer 232 is irradiated with ultraviolet light via the template 11, the resist layer 232 becomes hardened, so that a resist pattern FP2 with the shape of the template 11 reflected therein is obtained as illustrated in FIG. 5G.

Figure 5J:
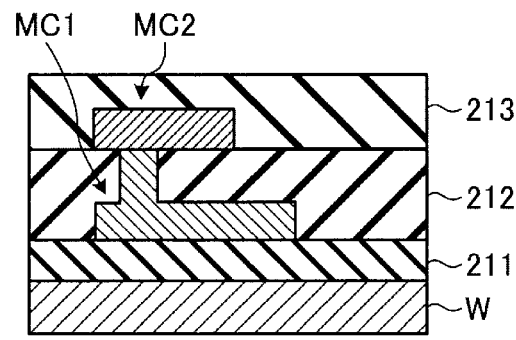
Figure 5H:
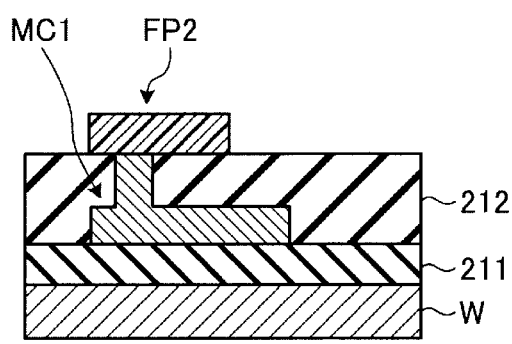

When a residual resist film RL is removed by, for example, etching, the resist pattern FP2 is left on the insulating film 212 as illustrated in FIG. 5H. Here, in a similar way to that performed on the resist pattern FP1, the resist pattern FP2 can be infiltrated with a metal. With this infiltration, the resist pattern FP2 is made to have electrical conductivity, thus becoming a metal-containing portion MC2 as illustrated in FIG. 5I.

The metal used for infiltrating the resist pattern FP2 may be the same as or may be different from the metal infiltrating the resist pattern FP1. The metal-containing portion MC2 may extend lengthwise along the same direction as which the protruding portion MC1R extends lengthwise or may extend lengthwise along a direction different from the direction along which the protruding portion MC1R extends lengthwise. Additionally, the extension length of the metal-containing portion MC2 may be greater than the width of the projection portion MC1P.

Figure 5K:
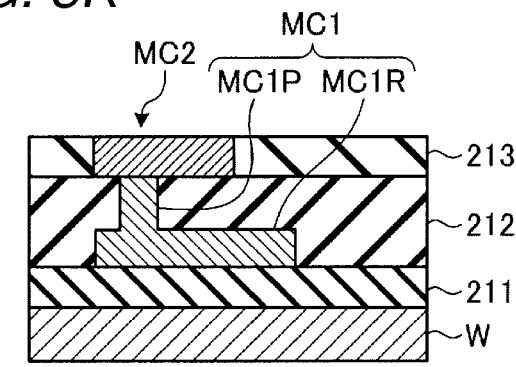
Figure 5I:
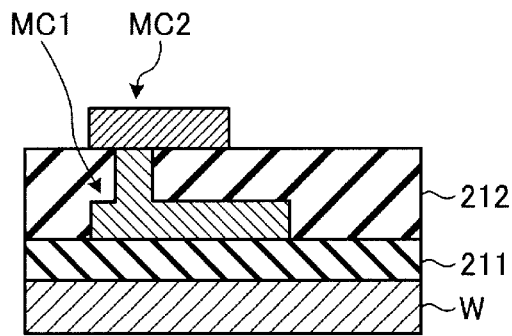

Next, an insulating film 213 is formed on the metal-containing portion MC2 and the insulating film 212 as illustrated in FIG. 5J, and the insulating film 213 is then polished by a CMP method, so that the upper surface of the metal-containing portion MC2 becomes flush with the upper surface of the insulating film 213 as illustrated in FIG. 5K. With the above-described processes, a structure in which, as illustrated in FIG. 5K, the metal-containing portion MC2 and the protruding portion MC1R of the metal-containing portion MC1 are interconnected via the projection portion MC1P is obtained.

As described above, in the third embodiment, metal infiltration processing is performed on the resist pattern FP1 (illustrated in FIG. 5A) which can be obtained by pressing the template 10 (illustrated in FIG. 4B) against the resist layer 231 (illustrated in FIG. 4A), so that the metal-containing portion MC1 is formed.

The metal-containing portion MC1 has electrical conductivity and also has the projection portion MC1P and the protruding portion MC1R, which correspond to the recessed portion 10D and the groove portion 10G of the template 10, respectively. Then, the projection portion MC1P is connected to the metal-containing portion MC2, which also has electrical conductivity. Accordingly, the protruding portion MC1R is able to serve as a wiring, the metal-containing portion MC2 is able to serve as a wiring in a layer upper than the protruding portion MC1R, and the projection portion MC1P is able to serve as a via which interconnects the protruding portion MC1R and the metal-containing portion MC2.

Moreover, since the resist pattern FP1 becomes the metal-containing portion MC1, the protruding portion MC1R, which is able to serve as a wiring layer in the lower layer, and the projection portion MC1P, which is able to serve as a via, are collectively formed as a single body. Accordingly, in the third embodiment, advantageous effects similar to those in the wiring fabrication methods described in the first and second embodiments are attained.

Furthermore, while the protruding portion MC1R and the projection portion MC1P are continuous with each other as a single body, the projection portion MC1P (which can be equivalent to a via) and the metal-containing portion MC2 (which can be equivalent to a wiring layer in the upper layer) are in contact with each other.

Modification Example 1 of Third Embodiment

Next, a modification example 1 of the third embodiment is described. In the third embodiment, the metal-containing portion MC1 is formed as illustrated in FIG. 5B by performing metal infiltration processing (metal impregnation) on the resist pattern FP1 (illustrated in FIG. 5A). However, in the present modification example, a conductive structure, which is equivalent to the metal-containing portion MC1, is formed with use of a metallic particle dispersion liquid. Specifically, a metallic particle dispersion liquid is applied onto the insulating film 211 by, for example, an inkjet method or spin coat method, so that a dispersion liquid film is formed. Before the solvent of the dispersion liquid film volatilizes from the dispersion liquid film, the template 10 is pressed against the dispersion liquid film. With this process, the groove portion 10G and the recessed portion of the template 10 are filled with the metallic particle dispersion liquid. After the template 10 is detached, a residual film left by the dispersion liquid can be removed. Here, the residual film is a film caused by a dispersion liquid left between the upper surface S of the template 10 and the insulating film 211. In other words, the residual film is equivalent to the above-mentioned residual resist film RL. The dispersion liquid film left on the insulating film 211 after removal of the residual film is subsequently heated to a high temperature under an atmosphere of an inert gas (e.g., a nitrogen gas or a noble gas), so that a conductive structure equivalent to the metal-containing portion MC1 is obtained.

Moreover, in a similar way, another dispersion liquid film of metallic particles can be formed on the insulating film 212, then the template 11 can be pressed against this dispersion liquid film. The residual film is then removed, and the remaining dispersion liquid film is thermally processed, so that, instead of the metal-containing portion MC2, a conductive structure with the shape of the groove portion 11G reflected therein is obtained.

These conductive structures have relatively high electrical conductivity and are thus able to serve as a wiring and a via. As mentioned above, using a dispersion liquid film of metallic particles enables forming the wiring M1 and the via V1, which are collectively formed as a single body, and the wiring M2. Moreover, the wiring M1 and the via V1 as well as the wiring M2 formed as mentioned above can have the same shapes as those of the wiring M1 and the via V1 as well as the wiring M2 in the first and second embodiments.

The average particle diameter of the metallic particles may be, for example, several tens of nanometers (nm) or less, and may preferably be 10 nm or less. In some examples, average particle diameter may be 5 nm or less. As the average particle diameter becomes smaller, the dispersiveness of particles in solvent increases. Moreover, the processing temperature for processing the metal-containing portions into the conductive structures may be in the range of, for example, 100° C. to 500° C. Additionally, instead of heating, photo-sintering using a xenon lamp may be employed, for example. Moreover, in the case of using copper-based ink, a reduction treatment may be performed under in an atmosphere of a reducing gas such as a hydrogen gas.

Examples of the metallic particles include particles of Gold (Au), silver (Ag), copper (Cu), rhodium (Rh), palladium (Pd), and platinum (Pt). Moreover, a dispersion liquid may be obtained from particles of a plurality of metals selected from the above-mentioned metals. A dispersion liquid of metallic particles can also be called metallic ink or metallic nanoink.

Moreover, depending on types of dispersion liquids, a dispersion liquid film may also be processed into a conductive structure by pressing the template 10 against the dispersion liquid film and irradiating the dispersion liquid film with light emitted from, for example, a flash lamp.

Modification Example 2 of Third Embodiment

Instead of the dispersion liquid of metallic particles described in modification example 1, conductive polymers such as polyacetylene, polythiophene, or polyethylenedioxythiophene may be used. More specifically, instead of forming a dispersion liquid film made from a dispersion liquid of metallic particles on the insulating film 211, a liquid conductive polymer layer can be formed and then the template 10 can be pressed against the liquid conductive polymer layer. The liquid conductive polymer layer may be formed by, for example, the spin coat method or the inkjet method. Furthermore, while conductive polymers include, for example, an electron-hole conductive polymer, an ion conductive polymer, and a complex polymer, in general, any conductive polymer may be used. In the case of using an electron-hole conductive polymer (or an organic semiconductor), it is also possible to increase electrical conductivity by doping with an acceptor impurity or a donor impurity.

Thus, the wiring M1 and the via V1, which are formed as a single body, and the wiring M2 can be formed of conductive polymers.

Fourth Embodiment

Next, a wiring fabrication method according to a fourth embodiment is described with reference to FIGS. 6A, 6B, 6C, 6D, 6E, 6F, 6G, 6H, 6I, 6J, and 6K. The following description focuses on differences from the wiring fabrication method described in the second and third embodiments.

Figure 6A:
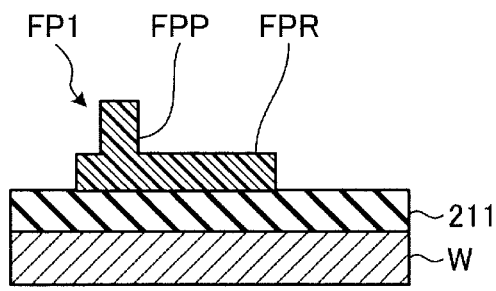
FIGS. 6A, 6B, 6C, 6D, 6E, 6F, 6G, 6H, 6I, 6J, and 6K are diagrams schematically depicting wiring pattern cross sections obtained during processes of a wiring fabrication method according to a fourth embodiment.

Referring to FIG. 6A, a resist pattern FP1 is formed on an insulating film 211 formed on a wafer W. The resist pattern FP1 has a protruding portion FPR, which corresponds to a groove portion 10G of a template 10 (illustrated in FIG. 1), and a projection portion FPP, which corresponds to a recessed portion 10D of the template 10. Furthermore, such a configuration is formed by performing the same processes in the second embodiment illustrated in FIG. 4A to FIG. 4D.

Figure 6D:
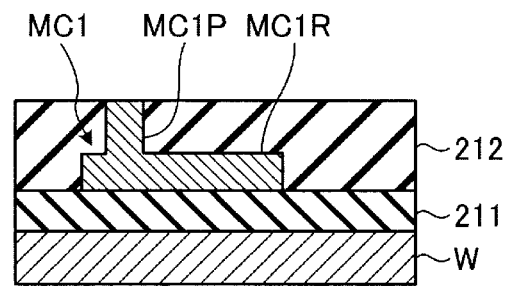
Figure 6B:
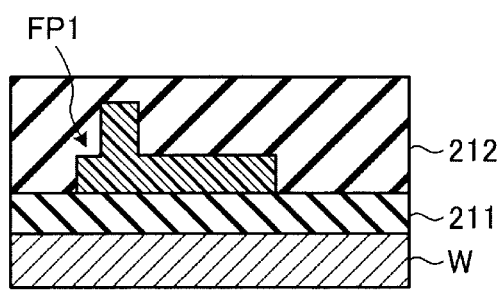

Next, an insulating film 212 is formed on the resist pattern FP1 and the insulating film 211 as illustrated in FIG. 6B. Then, the insulating film 212 is polished by the CMP method, so that the upper surface of the insulating film 212 becomes flush with the upper surface of the resist pattern FP1 as illustrated in FIG. 6C.

After that, metal infiltration processing is performed on the resist pattern FP1 in a similar way to the metal infiltration processing performed in the third embodiment. With this processing performed, a TMA gas diffuses into the resist pattern FP1 from the portion of the resist pattern FP1 exposed at the upper surface of the insulating film 212, and the TMA gas is then oxidized by an oxidation gas, so that Al atoms are precipitated within the resist pattern FP1. This causes the resist pattern FP1 to become a metal-containing portion MC1 having electrical conductivity as illustrated in FIG. 6D. The metal-containing portion MC1 has a projection portion MC1P, which results from the projection portion FPP of the resist pattern FP1, and a protruding portion MC1R, which results from the protruding portion FPR of the resist pattern FP1.

In the present embodiment, such metal infiltration processing is performed after the resist pattern FP1 is embedded into the insulating film 212. In general, infiltrating metallic components coordinate selectively with functional groups (e.g., carboxyl groups) present in the material of the resist pattern FP1. Since such functional groups are not present (or not substantially so) in the insulating film 212, the any infiltrating metallic components are not incorporated into the insulating film 212. In this respect, the present embodiment differs from the third embodiment, in which, only after being subjected to metallic infiltration processing, is the resist pattern FP1 covered by the insulating film 212.

Figure 6E:
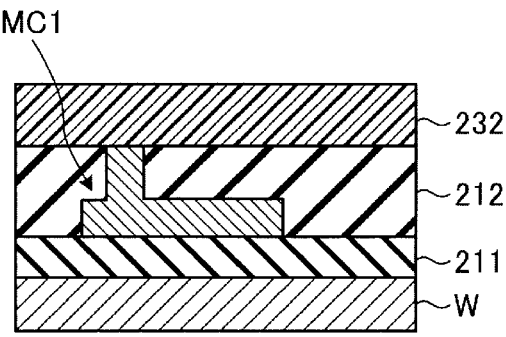
Figure 6C:
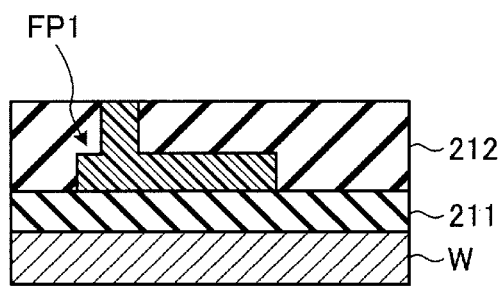
Figure 6F:
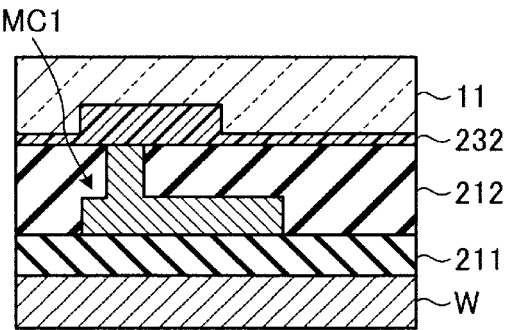

Next, as illustrated in FIG. 6E, a resist layer 232 is formed on the metal-containing portion MC1 and the insulating film 212. Then, a template 11 having a groove portion 11G is pressed against the resist layer 232 as illustrated in FIG. 6F. When, with the template 11 kept pressed against the resist layer 232, the resist layer 232 is irradiated with ultraviolet light via the template 11, the resist becomes hardened.

Figure 6G:
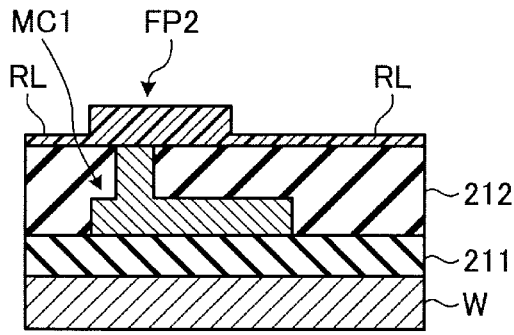

Upon detaching of the template 11, as illustrated in FIG. 6G, a resist pattern FP2 is obtained. Subsequently, upon removal of a residual resist film RL, as illustrated in FIG. 6H, the resist pattern FP2 is left on the insulating film 212.

Figure 6J:
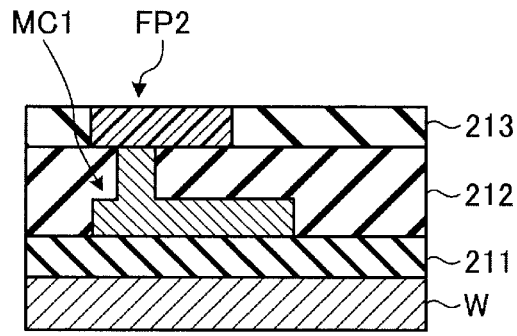
Figure 6H:
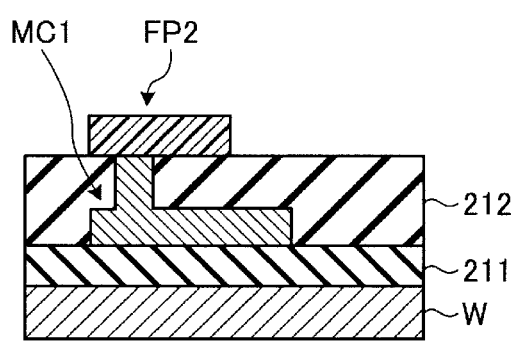
Figure 6K:
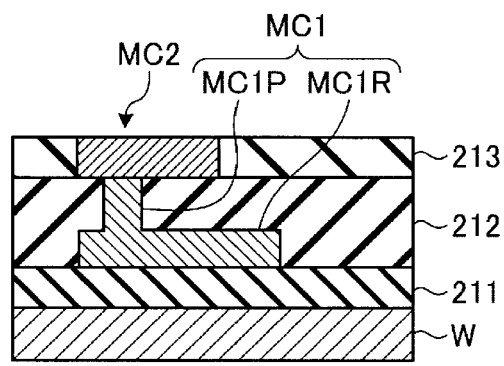
Figure 6I:
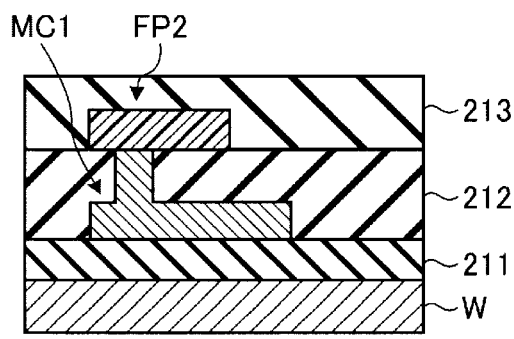

Next, an insulating film 213 is formed on the resist pattern FP2 and the insulating film 212 as illustrated in FIG. 6I, and the insulating film 213 is then polished by the CMP method, so that the upper surface of the insulating film 213 becomes flush with the upper surface of the resist pattern FP2 as illustrated in FIG. 6J.

After that, metal infiltration processing similar to the metal infiltration processing performed on the resist pattern FP1 is performed on the resist pattern FP2, so that a metal-containing portion MC2 is obtained as illustrated in FIG. 6K. However, a metal infiltrating the resist pattern FP2 may be the same as or may be different from a metal used for the resist pattern FP1. The fourth embodiment differs from the third embodiment, in that, metal infiltration processing is performed on the resist pattern FP2 after the resist pattern FP2 has been embedded into the insulating film 213 (with the upper surface of the resist pattern FP2 exposed by CMP) rather than before, as in the third embodiment. However, the protruding portion MC1R and the projection portion MC1P as well as the metal-containing portion MC2 in the fourth embodiment can have the same shapes as those in the third embodiment.

As described above, in the fourth embodiment, the metal-containing portions MC1 and MC2 are formed. Then, the protruding portion MC1R of the metal-containing portion MC1 is able to serve as a wiring, the metal-containing portion MC2 is able to serve as a wiring in a layer upper than the protruding portion MC1R, and the projection portion MC1P is able to serve as a via which interconnects the protruding portion MC1R and the metal-containing portion MC2. The metal-containing portion MC1 derives from the resist pattern FP1 formed by pressing the template against a resist layer. Thus, the protruding portion MC1R, which is able to serve as a wiring in a lower layer, and the projection portion MC1P, which is able to serve as a via, are collectively formed as a single body. Accordingly, in the fourth embodiment, advantageous effects similar to those in the wiring fabrication methods described in the first to third embodiments are attained.

Application Examples

The wiring fabrication method described in each of the first to fourth embodiments (including modification examples) may be used as, for example, a part of a method for manufacturing a semiconductor device.

Figure 7:
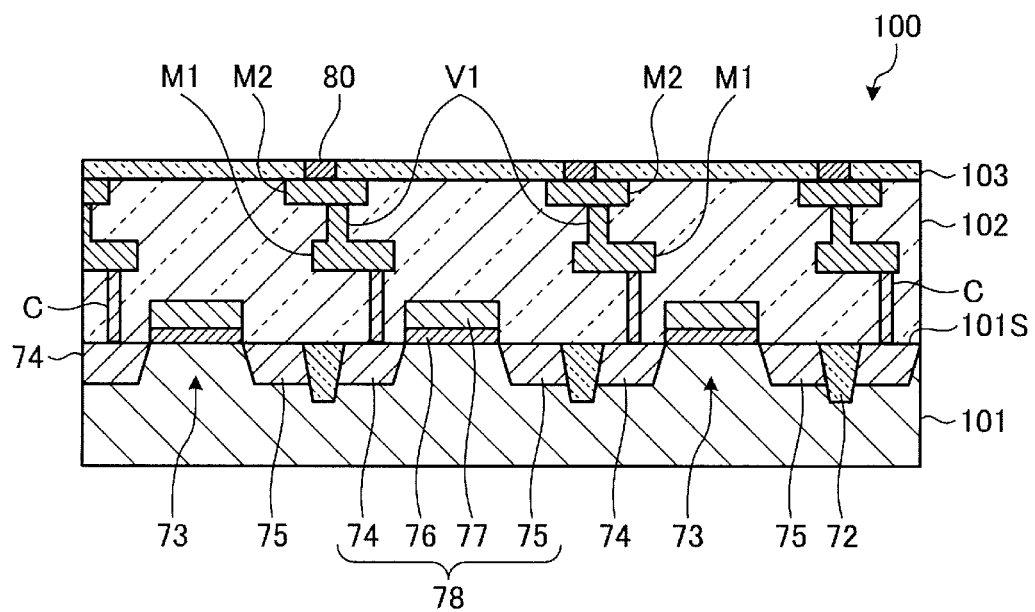
FIG. 7 is a cross-sectional view schematically illustrating an example of a semiconductor device manufactured in a method for manufacturing a semiconductor device to which a wiring fabrication method according to each described embodiment can be applied.

FIG. 7 illustrates an example of a semiconductor device which is able to be manufactured by such methods for manufacturing a semiconductor device. As illustrated in FIG. 7, the semiconductor device 100 includes a semiconductor substrate 101 and an insulating layer 102 formed on the semiconductor substrate 101. Inside the semiconductor substrate 101, element isolation insulating films 72 are locally provided in such a way as to border the upper surface 101S of the semiconductor substrate 101. An upper portion of the semiconductor substrate 101 is partitioned into a plurality of semiconductor regions 73 by the element isolation insulating films 72. A source region 74 and a drain region 75 are formed in at least some semiconductor regions 73. On the upper surface 101S of the semiconductor substrate 101, a gate insulating film 76 and a gate electrode 77 are provided in each region between the source region 74 and the drain region 75. A field-effect type transistor 78 is formed by the source region 74, the drain region 75, the gate insulating film 76, and the gate electrode 77.

In FIG. 7, on the insulating layer 102 formed on the semiconductor substrate 101, two different wiring layers are provided. The lower wiring layer includes a wiring M1 provided therein and the upper wiring layer includes a wiring M2 provided therein. The wiring M1 and the wiring M2 are interconnected by a via V1. The upper surface of the wiring M2 is made flush with the upper surface of the insulating layer 102, and an insulating film 103 is provided on the wiring M2 and the insulating layer 102. The insulating film 103 has an opening at each position corresponding to the wiring M2, and a metal pad 80 is provided in the opening. Moreover, the wiring M1 and the source region 74 are interconnected by a contact C.

The semiconductor device 100 having the above-described configuration is able to serve as, for example, a control chip which controls an array chip in which a plurality of memory cells is three-dimensionally arranged. In this case, the semiconductor device 100 is joined to the array chip at the metal pad 80 and an associated metal pad of the array chip being joined together by, for example, a metal bump.

The semiconductor device 100 is able to be manufactured by a method for manufacturing a semiconductor device according to the present disclosure which is obtained by combining various additional fabrication processes in semiconductor manufacturing as appropriate. The method for manufacturing a semiconductor device includes the wiring fabrication method according to each of the above-described embodiments, in which a wiring M1 and a via V1 are collectively as a single body.

Addition modifications include, for example, when, as in the first embodiment, a resist mask IM is formed on a conductive material film 221 and the conductive material film 221 is etched with the resist mask IM used as a mask, so that a wiring M1 and a via V1 are formed, a hard mask film may be formed on the conductive material film 221 beforehand and the resist mask IM may be formed on the hard mask film. According to this process, the hard mask material film can be etched using the resist mask IM as a mask, so that a hard mask having a protruding portion corresponding to the groove portion 10G and a projection portion corresponding to the recessed portion 10D is formed. Then, the conductive material film 221 is etched with the hard mask used as a mask, so that the wiring M1 and the via V1 are formed. The hard mask material film may be, for example, a spin-on carbon (SOC) film or a spin-on glass (SOG) film.

Moreover, while, in the first embodiment, the resist mask IM2 is formed with use of the template 11, in other examples, the resist mask IM2 may be formed without use of a template, in other words, a resist mask similar to the resist mask IM2 may be formed by applying a photoresist layer onto the conductive material film 222 and irradiating the photoresist layer with, for example, ultraviolet light via a photomask having a predetermined light-blocking pattern (e.g., a reticle). Similarly, the resist pattern FP2 in the third and fourth embodiments may also be formed by a photoresist layer being exposed via a photomask having a predetermined light-blocking pattern.

Additionally, while, in the third and fourth embodiments, the resist patterns FP1 and FP2 are exposed to a TMA gas, instead of a TMA gas, another organometallic gas containing a metallic element other than aluminum may be used. Examples of such a metallic element include chromium (Cr), hafnium (Hf), indium (In), manganese (Mn), molybdenum (Mo), ruthenium (Ru), tantalum (Ta), titanium (Ti), vanadium (V), tungsten (W), and zirconium (Zr). Moreover, two or three or more of these metallic elements may be combined.

Moreover, the organic-metallic component is not limited to one including a methyl group, and an ethyl group or another organic group may be used in other examples. Examples of such an organic-metallic component include bis(cyclopentadienyl) chromium $(Cr(C_2H_5)_2)$, cyclopentadienyl manganese tricarbonyl $((C_5H_5)Mn(Co)_3)$, tetrakis(dimethylamino)titanium (TDMAT), tetrakis(ethylmethylamino)titanium (TEMAT), titanium tetra tert-butoxide (Ti$(OtBu)_4$), tetrakis(ethylmethylamino)zirconium (TEMAZ), tetrakis(dimethylamino)zirconium (TDMAZ), zirconium tetra tert-butoxide (Zr$(OtBu)_4$), tetrakis(dimethylamino)hafnium (TDMAH), tetrakis(ethylmethylamino)hafnium (TEMAH), tetrakis(diethylamino)hafnium (TDEAH), and hafnium tetra tert-butoxide (Hf$(OtBu)_4$). Moreover, a halide gas such as $AlCl_3$, $MoF_6$, $WF_6$, $TiCl_4$, $ZrCl_4$, or $HfCl_4$ may be used for the metal infiltration processing in some examples.

Moreover, in the third and fourth embodiments, it is desirable that the resist layer 231 (or 232) be formed from, for example, a photo-curable organic material including a double bond between a carbon atom and an oxygen atom such as a carbonyl group. This is because, if such an organic material is used to form the resist layer 231 (or 232), the double bond between a carbon atom and an oxygen atom in the organic material facilitates incorporation (coordination) of the metallic element. An example of such an organic material is a methacrylic resin-based resist material.

While an electrical connection between two wiring layers, e.g., the wiring M1 and the wiring M2, made with the via V1 is described above, another wiring of an upper wiring layer may be formed in a similar manner. Specifically, with respect to the resist layer 232 illustrated in FIG. 2K, a template in which a groove portion and a hole formed at the bottom surface of the groove portion can be provided in a predetermined pattern, as with the template 10, and may be used as appropriate. That is, processes similarly to those of FIG. 2C to 2J may be repeated for additional wiring levels.

Moreover, while, in the above-described embodiments, a process for polishing the insulating films 212 and 213 by a CMP method is described, instead of using a CMP method, an etch-back process or the like may be performed on the whole surfaces of the insulating films 212 and 213.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wiring fabrication method, comprising:
    pressing a first template, which includes a first recessed portion and a second recessed portion at a bottom of the first recessed portion, against a first film to form a first pattern including a first raised portion, corresponding to the first recessed portion, and a second raised portion, corresponding to the second recessed portion, the second raised portion protruding from the first raised portion;
    forming a first wiring, corresponding to the first raised portion, and a via, corresponding to the second raised portion, the via protruding from the first wiring; and
    forming a second wiring contacting the via, the via extending between the first wiring and the second wiring, wherein
    forming the second wiring comprises:
        forming a second conductive material film contacting the via;
        forming a second film on the second conductive material film;
        forming a second pattern in the second film; and
        etching the second conductive material film using the second pattern as a mask to form the second wiring contacting the via.

2. The wiring fabrication method according to claim 1, wherein
    the first pattern is formed on a first conductive material film, and
    the first wiring and the via are formed by etching the first conductive material film using the first pattern as a mask.

3. The wiring fabrication method according to claim 1, wherein
    the first film is formed from a photocurable organic material, and
    the wiring fabrication method further comprises:
    forming a first insulating film to cover the first pattern;
    removing portions of the first insulating film to expose a surface of the second raised portion of the first pattern;
    removing the first pattern from the first insulating film to form a cavity with the shape of the first pattern in the first insulating film; and
    filling the cavity with a conductive material to form the first wiring and the via.

4. The wiring fabrication method according to claim 1, wherein
    the first film is formed from a photocurable organic material, and the wiring fabrication method further comprises:
infiltrating the first pattern with a metal to form the first wiring and the via.

5. The wiring fabrication method according to claim 1, wherein
the first film is formed from a photocurable organic material, and
the wiring fabrication method further comprises:
forming a first insulating film covering the first pattern;
exposing an upper surface of the second raised portion of the first pattern by removing portions of the first insulating film; and
infiltrating the first pattern with a metal from the exposed upper surface of the second raised portion to form the first wiring and the via.

6. The wiring fabrication method according to claim 1, wherein
the first film is a conductive material, and
the first wiring and the via are formed of the conductive material.

7. The wiring fabrication method according to claim 6, wherein the conductive material is a conductive polymer or a liquid dispersion of metallic particles.

* * * * *